United States Patent
Forrest et al.

(10) Patent No.: US 11,744,138 B2
(45) Date of Patent: Aug. 29, 2023

(54) ORGANIC PHOTOSENSITIVE DEVICES MADE USING SEMI-ORTHOGONAL SOLVENTS AND METHODS OF MAKING THE SAME

(71) Applicant: The Regents of the University of Michigan, Ann Arbor, MI (US)

(72) Inventors: Stephen R. Forrest, Ann Arbor, MI (US); Brian E. Lassiter, Ypsilanti, MI (US); Jeramy D. Zimmerman, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 105 days.

(21) Appl. No.: 16/946,696

(22) Filed: Jul. 1, 2020

(65) Prior Publication Data
US 2021/0005815 A1    Jan. 7, 2021

Related U.S. Application Data

(60) Provisional application No. 62/869,365, filed on Jul. 1, 2019.

(51) Int. Cl.
*H10K 71/15* (2023.01)
*H10K 30/30* (2023.01)
*H10K 30/57* (2023.01)
*H10K 85/20* (2023.01)
*H10K 85/60* (2023.01)

(52) U.S. Cl.
CPC ............ *H10K 71/15* (2023.02); *H10K 30/30* (2023.02); *H10K 30/57* (2023.02); *H10K 85/211* (2023.02); *H10K 85/221* (2023.02); *H10K 85/631* (2023.02); *H10K 85/633* (2023.02); *H10K 85/657* (2023.02); *H10K 85/6572* (2023.02)

(58) Field of Classification Search
CPC ............ H01L 51/0007; H01L 27/302; H01L 51/0046; H01L 51/0048
See application file for complete search history.

(56) References Cited

PUBLICATIONS

Rao et al., "Application of solution processable squaraine dyes as electron donors for organic bulk-heterojunction solar cells", Photochem. Photobiol. Sci., 2013, 12, 1688. (Year: 2013).*

* cited by examiner

*Primary Examiner* — Tae-Sik Kang
(74) *Attorney, Agent, or Firm* — Finnegan, Henerson, Farabow, Garrett & Dunner, LLP

(57) ABSTRACT

Disclosed herein are organic photosensitive optoelectronic device comprising a first layer comprising one or more of a first layer material, a second layer comprising one or more of a second layer material, and a third layer comprising one or more of a third layer material. The second layer may be dissolved in a semi-orthogonal solvent. The first layer and the third layer may be very slightly soluble or practically insoluble in the semi-orthogonal solvent.

12 Claims, 6 Drawing Sheets

ORGANIC PHOTOSENSITIVE DEVICES MADE USING SEMI-ORTHOGONAL SOLVENTS AND METHODS OF MAKING THE SAME

This application claims priority to U.S. Provisional Application No. 62/869,365, filed on Jul. 1, 2019, which is incorporated herein by reference in their entirety.

This invention was made with government support under DE-FG36-08GO18022 awarded by the U.S. Department of Energy, and FA9550-10-1-0339 awarded by the Air Force Office of Scientific Research. The government has certain rights in the invention. The government has certain rights in the subject matter of this application.

The subject matter of the present disclosure was made by, on behalf of, and/or in connection with one or more of the following parties to a joint university-corporation research agreement: The Regents of the University of Michigan and NanoFlex Power Corporation. The agreement was in effect on and/or before the date the subject matter of the present disclosure was prepared and was made as a result of activities undertaken within the scope of the agreement.

The present disclosure generally relates to organic photosensitive devices made using semi-orthogonal solvents. Methods of making such devices are also disclosed, which use semi-orthogonal solvents.

Optoelectronic devices rely on the optical and electronic properties of materials to either produce or detect electromagnetic radiation electronically or to generate electricity from ambient electromagnetic radiation.

Photosensitive optoelectronic devices convert electromagnetic radiation into electricity. Solar cells, also called photovoltaic (PV) devices, are a type of photosensitive optoelectronic device that is specifically used to generate electrical power. Another type of photosensitive optoelectronic device is a photoconductor cell. In this function, signal detection circuitry monitors the resistance of the device to detect changes due to the absorption of light. Another type of photosensitive optoelectronic device is a photodetector. In operation a photodetector is used in conjunction with a current detecting circuit which measures the current generated when the photodetector is exposed to electromagnetic radiation and may have an applied bias voltage.

Organic photovoltaic (OPV) cells have many potential advantages when compared to traditional silicon-based devices. OPV cells are light weight, economical in materials use, and can be deposited on low cost substrates, such as flexible plastic foils. However, OPV devices can have relatively low external quantum efficiency (electromagnetic radiation to electricity conversion efficiency), being on the order of 1% or less.

To utilize solar radiation more effectively, one possible solution is to stack multiple photoactive layers with complementary absorption in series to make a tandem OPV. Typically, such a tandem structure has a front cell with a high bandgap material, an interconnecting layer (ICL), and a rear cell with a low band gap (LBG) material. Furthermore, the structure enables a reduction of potential loss during the photon-to-electron conversion process, and combines the electrical potential of the individual bulk heterojunction cells.

To fabricate organic photosensitive optoelectronic devices, such as organic photovoltaic devices, organic materials are deposited as thin films via vacuum deposition, spin-coating, doctor-blading, or other similar techniques. For depositing layers from a solution, chlorinated solvents are frequently used to dissolve organic materials. However, these conventional solvents partially re-dissolves underlaying layers and damages the underlaying layers. This damage prevents a fabrication of multilayer structures. Accordingly, there remains a need to further develop organic photosensitive optoelectronic device using a solvent, which does not significantly damage the underlying layers.

In one aspect, the present disclosure is directed to an organic photosensitive optoelectronic device comprising a first layer comprising one or more of a first layer material, a second layer comprising one or more of a second layer material, and a third layer comprising one or more of a third layer material, wherein the second layer is dissolved in a semi-orthogonal solvent. The first layer and the third layer are very slightly dissolved or practically insoluble in the semi-orthogonal solvent.

In some embodiments, the second layer is deposited via spin coating.

In some embodiments, the first layer material is chosen from $C_{60}$, $C_{70}$, $C_{76}$, $C_{82}$, $C_{84}$, and derivatives thereof; the second layer is chosen from CBZSQ, PTSQ, DPSQ, 1NPSQ, 2NPSQ, USSQ, DPUSQ, and YSQ; the third layer material is chosen from Al, Ag, Au, $MoO_3$, Li, LiF, Sn, Ti, $WO_3$, indium tin oxide (ITO), tin oxide (TO), gallium indium tin oxide (GITO), zinc oxide (ZO), zinc indium tin oxide (ZITO) and derivatives thereof; and the semi-orthogonal solvent is chosen from tetrahydrofuran or tetrahydrofuran derivatives.

In some embodiments, 1 ml of the semi-orthogonal solvent dissolves about 0.05 mg or less of the first layer and the third layer at 25° C., and 1 ml of the semi-orthogonal solvent dissolves about 100 mg or more of the second layer at 25° C.

In another aspect, the present disclosure is directed to a method of preparing an organic photosensitive optoelectronic device, the method comprising: depositing a first layer comprising one or more of a first layer material, depositing a second layer comprising one or more of a second layer material via spin coating, and depositing a third layer comprising one or more of a third layer material. The second layer is dissolved in a semi-orthogonal solvent, and the first layer and the third layer are very slightly dissolved or practically insoluble in the semi-orthogonal solvent.

In some embodiments, the first layer material is chosen from $C_{60}$, $C_{70}$, $C_{76}$, $C_{82}$, $C_{84}$, and derivatives thereof; the second layer is chosen from CBZSQ, PTSQ, DPSQ, 1NPSQ, 2NPSQ, USSQ, DPUSQ, and YSQ; the third layer material is chosen from Al, Ag, Au, $MoO_3$, Li, LiF, Sn, Ti, $WO_3$, indium tin oxide (ITO), tin oxide (TO), gallium indium tin oxide (GITO), zinc oxide (ZO), zinc indium tin oxide (ZITO) and derivatives thereof; and the semi-orthogonal solvent is chosen from tetrahydrofuran or tetrahydrofuran derivatives.

In some embodiments, 1 ml of the semi-orthogonal solvent dissolves about 0.05 mg or less of the first layer and the third layer at 25° C., and 1 ml of the semi-orthogonal solvent dissolves about 100 mg or more of the second layer at 25° C.

Figure 1:
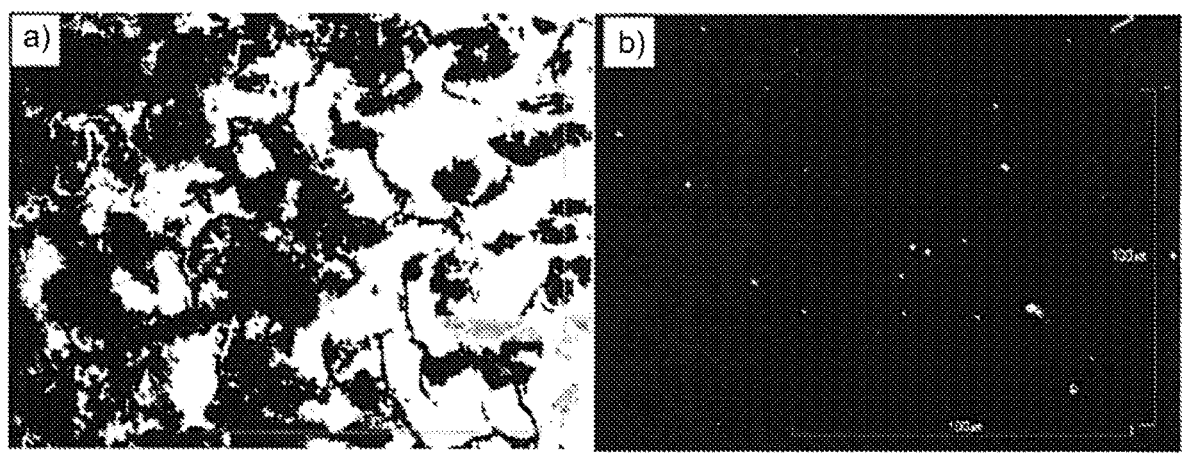
FIG. 1 illustrate optical micrographs of the structure: glass/ITO (150 nm)/$MoO_3$ (8 nm)/2,4-bis[4-(N-Phenyl-1-naphthylamino)-2,6-dihydroxyphenyl]squaraine (1-NPSQ) (8 nm)/$C_{60}$ (40 nm)/3,4,9,10 perylenetetracarboxylic bisbenzimidazole (PTCBI) (5 nm)/Ag (1 nm)/$MoO_3$ (8 nm). The samples were then spin-coated with either a 1-NPSQ and 1,2-dichlorobenzene solution (DCB) as shown in FIG. 1(a) or a 2,4-bis[4-(N,N-diphenylamino)-2,6-dihydroxyphenyl] squaraine (DPSQ) and tetrahydrofuran (THF) solution as shown in FIG. 1(b).

As used in the present disclosure, the following words, phrases, and symbols are generally intended to have the meanings set forth below, except to the extent in which they are used indicates otherwise. The following abbreviations and terms have the indicated meanings throughout:

When a first layer is described as disposed or deposited "over" or "above" a second layer, the first layer is positioned further away from the substrate of the structure. The first layer may be in direct contact with the second layer or there may be other layers between the first layer and the second layer. For example, a sacrificial layer may be described as disposed "over" or "above" a growth substrate, even though there may be various layers in between. Similarly, when a first layer is described as disposed or deposited "between" a second layer and a third layer, there may be other layers between the first layer and the second layer, and/or the first layer and the third layer.

"Top" means farthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

Level of solubility is defined as follows. When 1 ml of solvent dissolves more than 33 mg of solute, it may be described as "soluble." When 1 ml of solvent dissolves from about 10 mg to about 33 mg of solute, it may be described as "sparingly soluble." When 1 ml of solvent dissolves from about 1 mg to about 10 mg of solute, it may be described as "slightly soluble." When 1 ml of solvent dissolves from about 0.1 mg to about 1 mg of solute, it may be described as "very slightly soluble." When 1 ml of solvent dissolves less than 0.1 mg of solute, it may be described as "practically insoluble." When a layer is "dissolved" in a solvent, the layer is soluble in the solvent. When a layer is "very slightly dissolved" in a solvent, the layer is very slightly soluble in the solvent.

All numerical ranges herein include all numerical values and ranges of all numerical values within the recited range of numerical values. Further, while the numerical ranges and parameters setting forth the broad scope of the disclosure are approximations as discussed above, the numerical values set forth in the Examples section are reported as precisely as possible. It should be understood, however, that such numerical values inherently contain certain errors resulting from the measurement equipment and/or measurement technique.

The present disclosure is directed to an organic photosensitive optoelectronic device comprising a first layer comprising one or more of a first layer material, a second layer comprising one or more of a second layer material, and a third layer comprising one or more of a third layer material. The second layer is dissolved in a semi-orthogonal solvent, and the first layer and the third layer are very slightly soluble or practically insoluble in the semi-orthogonal solvent.

In some embodiments, the first layer is an acceptor layer, which comprises one or more of a first layer material. The first layer material may be any known acceptor materials. The first layer material may be comprised of, for example, perylenes, naphthalenes, fullerenes, nanotubules, or derivatives thereof. Exemplary acceptor materials include $C_{60}$, $C_{70}$, $C_{84}$, 3,4,9,10-perylenetracarboxylic dianhydride (PTCDA), 3,4,9,10-perylenetracarboxylic diimide (PTCDI), 3,4,9,10-perylenetetracarboxylic-bis-benzimidazole (PTCBI), 1,4,5,8-naphthalenetetracarboxylic dianhydride (NTCDA), copper pthalocyanine (CuPc), and copper-hexadecafluoro-phthalocyanine ($F_{16}$-CuPc).

In some embodiments, the first layer material is chosen from fullerenes and fullerene derivatives. For example, the first layer material may be $C_{60}$, $C_{70}$, $C_{76}$, $C_{82}$, or $C_{84}$. In some embodiments, the first layer material includes only one material, but in other embodiments the first layer material may include two or more materials. In some embodiments, the first layer material may be $C_{60}$.

In some embodiments, the second layer is a donor layer, which comprises one or more of a second layer material. The second layer material may be any donor materials. In some embodiments, the second layer material may be chosen from squaraines or squaraine derivatives. In some embodiments, the second layer material may be comprised of, for example, 2,4-bis[4-N-carbazolo-2,6-dihydroxyphenyl]squaraine (CBZSQ), 2,4-bis[4-N-phenothiazino-2,6-dihydroxyphenyl] squaraine (PTSQ), 2,4-bis[4-(N,N-diphenylamino)-2,6-dihydroxyphenyl] squaraine (DPSQ), 2,4-bis[4-(N-Phenyl-1-naphthylamino)-2,6-dihydroxyphenyl] squaraine (1NPSQ), 2,4-bis[4-(N-Phenyl-2-naphthylamino)-2,6-dihydroxyphenyl] squaraine (2NPSQ), {2-[4-(N,N-diisobutylamino)-2,6-dihydroxyphenyl]-4-diphenylamino} squaraine (USSQ), {2-[4-(N,N-diphenylamino)-2,6-dihydroxyphenyl]-4-diphenylamino} squaraine (DPUSQ), or diphenylamino-squarate (YSQ).

Structures and synthetic schemes of various squaraines are described in U.S. Publication No. US 2012/0248419, which is incorporated herein by reference in its entirety. In some embodiments, the second layer may comprise at least two different squaraines to provide more efficient light harvesting at wavelengths ranging from 500 to 850 nm, when compared to a donor-acceptor heterojunction comprising, at most, one squaraine. Such squaraine compounds may be used alone or in addition to other donor materials.

In some embodiments, the second layer may be fabricated using vacuum deposition, spin coating, organic vapor-phase deposition, inket printing and other methods known in the art. In some embodiments, the second layer may be deposited by one or more processes chosen from vacuum deposition and solution processing. Solution processing may comprise one or more technique chosen from spin coating, spray coating, dip coating, or doctor's blading. In one embodiment, the second layer is deposited using spin coating.

In some embodiments, the third layer is a buffer layer, which comprises one or more of a third layer material. The third layer material may be Al, Ag, Au, $MoO_3$, Li, LiF, Sn, Ti, $WO_3$, indium tin oxide (ITO), tin oxide (TO), gallium indium tin oxide (GITO), zinc oxide (ZO), or zinc indium tin oxide (ZITO). In some embodiments, the third layer material is $MoO_3$.

In some embodiments, the semi-orthogonal solvent is a heterocyclic organic compound. For example, the semi-orthogonal solvent may be furan, tetrahydrofuran, thiolane, thiophene, pyrrole, pyrrolidine, or derivatives thereof. In some embodiments, the semi-orthogonal solvent may be a heterocyclic aprotic compound, such as tetrahydrofuran (THF) or its derivative. THF derivatives are described in U.S. Publication No. 2016-0215119, which is incorporated herein in its entirety.

In some embodiments, the second layer is dissolved in a semi-orthogonal solvent. In some embodiments, the semi-orthogonal solvent dissolves about 33 mg, 50 mg, 70 mg, 100 mg, 200 mg, 300 mg, 400 mg, 500 mg, 600 mg, 700 mg, 800 mg, 900 mg, 1000 mg or more of the second layer at 25° C.

In some embodiments, the 1 ml of the semi-orthogonal solvent dissolves about 0.1 mg, 0.05 mg, 0.04 mg, 0.03 mg, 0.02 mg, 0.01 mg or less of the first layer at 25° C. In some embodiments, 1 ml of the semi-orthogonal solvent dissolves about 0.09 mg, 0.08 mg, 0.07 mg, 0.06 mg, 0.05 mg, 0.04 mg, 0.03 mg, 0.02 mg, 0.01 mg or less of the first layer at 25° C. In one embodiment, 1 ml of the semi-orthogonal solvent dissolves about 0.006 mg of the first layer.

In some embodiments, the 1 ml of the semi-orthogonal solvent dissolves about 0.1 mg, 0.05 mg, 0.04 mg, 0.03 mg, 0.02 mg, 0.01 mg or less of the third layer at 25° C. In some embodiments, 1 ml of the semi-orthogonal solvent dissolves about 0.09 mg, 0.08 mg, 0.07 mg, 0.06 mg, 0.05 mg, 0.04 mg, 0.03 mg, 0.02 mg, 0.01 mg or less of the third layer at 25° C. In one embodiment, 1 ml of the semi-orthogonal solvent dissolves about 0.009 mg, 0.008 mg, 0.007 mg, 0.006 mg, 0.005 mg, 0.004 mg, 0.003 mg, 0.002 mg, or 0.001 mg of the third layer.

In conventional organic electronics fabrication, chlorinated solvents are frequently used to dissolve organic materials to deposit thin films. However, conventional solvents, such as, 1,2-dichlorobenzene or chloroform, partially redissolve its underlying layers, significantly damaging the underlying layers. The device of the present disclosure avoids these damaging effects by dissolving only the second layer. The first layer and the third layer are very slightly dissolved or practically insoluble in the solvent. Thus, the device of the present disclosure avoids significant damages of the underlying layers.

In some embodiments, the first layer material is chosen from $C_{60}$, $C_{70}$, $C_{76}$, $C_{82}$, $C_{84}$, and derivatives thereof, the second layer is chosen from CBZSQ, PTSQ, DPSQ, 1NPSQ, 2NPSQ, USSQ, DPUSQ, and YSQ, and the third layer material is chosen from Al, Ag, Au, $MoO_3$, Li, LiF, Sn, Ti, $WO_3$, indium tin oxide (ITO), tin oxide (TO), gallium indium tin oxide (GITO), zinc oxide (ZO), zinc indium tin oxide (ZITO) and derivatives thereof. The semi-orthogonal solvent is chosen from tetrahydrofuran or tetrahydrofuran derivatives. The second layer is dissolved in a semi-orthogonal solvent, and the first layer and the third layer are very slightly soluble or practically insoluble in the semi-orthogonal solvent.

In some embodiments, the first layer material comprises $C_{60}$ or $C_{60}$ derivatives, the second layer comprises DPSQ, 1NPSQ or derivatives thereof, and the third layer material comprises $MoO_3$ or $MoO_3$ derivatives. The semi-orthogonal solvent is chosen from tetrahydrofuran or tetrahydrofuran derivatives. The second layer is dissolved in a semi-orthogonal solvent, and the first layer and the third layer are very slightly soluble or practically insoluble in the semi-orthogonal solvent.

In some embodiments, the first layer material is $C_{60}$, the second layer is DPSQ, and the third layer material comprises $MoO_3$. The semi-orthogonal solvent is chosen from tetrahydrofuran. The second layer is dissolved in a semi-orthogonal solvent, and the first layer and the third layer are very slightly soluble or practically insoluble in the semi-orthogonal solvent.

In some embodiments, the first layer material is $C_{60}$, the second layer is 1NPSQ, and the third layer material comprises $MoO_3$. The semi-orthogonal solvent is chosen from tetrahydrofuran. The second layer is dissolved in a semi-orthogonal solvent, and the first layer and the third layer are very slightly soluble or practically insoluble in the semi-orthogonal solvent.

In some embodiments, the device is a bulk heterojunction organic photovoltaic device. In some embodiments, the device is a tandem organic photovoltaic device.

An organic photosensitive optoelectronic device may include multiple layers. The device may include a substrate, an anode, a donor layer, an acceptor layer, a buffer layer and a cathode. Some of the layers (such as buffer layers) may be omitted. Other layers (such as reflective layers or additional acceptor and donor layers) may be added. The order of layers may be altered. Arrangements other than those specifically described may be used.

Embodiments of the devices described herein may comprise a substrate. The substrate may be any suitable substrate that provides desired structural properties. The substrate may be flexible or rigid, planar or non-planar. The substrate may be transparent, translucent or opaque. Plastic and glass are examples of rigid substrate materials that may be used herein. Plastic and metal foils are examples of flexible substrate materials that may be used according to the present disclosure. The material and thickness of the substrate may be chosen to obtain desired structural and optical properties.

Embodiments of the devices described herein may comprise electrodes. When used herein, the terms "electrode" and "contact" refer to layers that provide a medium for delivering photo-generated current to an external circuit or providing a bias voltage to the device. That is, an electrode, or contact, provides the interface between the active regions of an organic photosensitive optoelectronic device and a wire, lead, trace or other means for transporting the charge carriers to or from the external circuit.

Embodiments of the present disclosure may include, as one or more of the transparent electrodes of the photosensitive optoelectronic device, a highly transparent, non-metallic, low resistance cathode or a highly efficient, low resistance metallic/non-metallic compound cathode Embodiments of the devices described herein may comprise an anode, a cathode, and a photoactive region between the anode and the cathode. Organic photosensitive optoelectronic devices may also include at least one transparent electrode to allow incident radiation to be absorbed by the device.

Embodiments of the devices described herein may comprise one or more exciton blocking layers (EBLs). Exemplary electron or exciton blocking materials include, for example, bathocuproine (BCP), bathophenanthroline (BPhen), 3,4,9,10-perylenetetracarboxylicbis-benzimidazole (PTCBI), 1,3,5-tris(N-phenylbenzimidazol-2-yl)benzene (TPBi), tris(acetylacetonato) ruthenium(III) (RuAcac$_3$), and aluminum(III)phenolate (Alq$_2$OPH). In some embodiments, the EBL is situated between the acceptor layer and the cathode.

Non-limiting examples of organic materials for use in the photoactive layers of a photosensitive device include cyclometallated organometallic compounds. The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic refers to compounds which have an organic group bonded to a metal through a carbon-metal bond.

The present disclosure further encompasses methods of preparing an organic photosensitive optoelectronic device, which comprises depositing a first layer comprising one or more of a first layer material, depositing a second layer comprising one or more of a second layer material via a spin coating, and depositing a third layer comprising one or more of a third layer material. The second layer is dissolved in a semi-orthogonal solvent, and the first layer and the third layer are very slightly soluble or practically insoluble in the semi-orthogonal solvent.

In some embodiments, the first layer and the third layer are deposited before depositing the second layer. In some embodiments, the first layer and the third layer may be using vacuum deposition, spin coating, organic vapor-phase deposition, inkjet printing and other methods known in the art. In some embodiments, the second layer is deposited from a solution. For example, the second layer is deposited using spin coating. In some embodiments, the first layer and the third layer are deposited via vacuum deposition and the second layer is deposited via spin coating.

Figure 4:
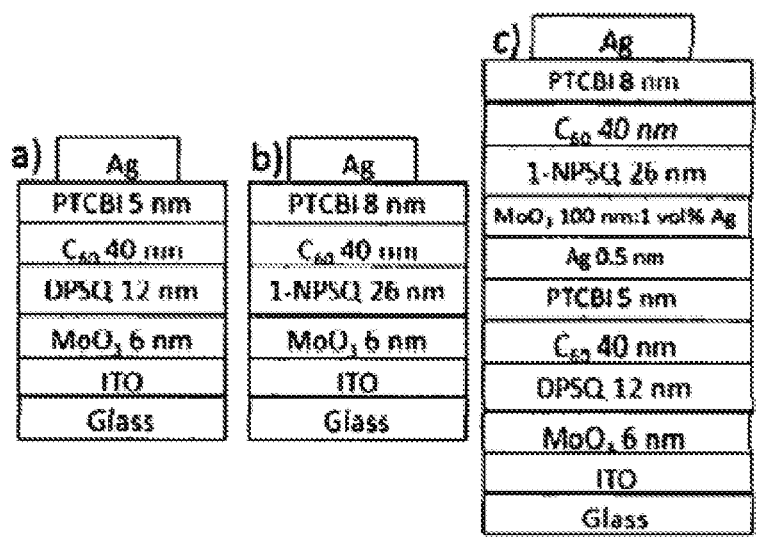
FIG. 4 illustrates schematic structures of the front, back, and tandem OPV devices using THF for the 1-NPSQ layers.

FIG. 4 illustrates two exemplary single OPV devices as shown in FIGS. 4(a) and (b) and a tandem OPV device in Figure (c). For single cells, the device structure consists of the following: glass/ITO (150 nm)/MoO$_3$ (6 nm)/donor layer/C$_{60}$ (40 nm)/buffer/Ag (100 nm). FIG. 4(a) illustrate a control device, which may be fabricated using a conventional fabrication method. The donor layer is 12 nm using DPSQ as the donor material, spin-coated from a chloroform solution. Device performance was typical, as shown in Table 2 as the "Front" cell, with a power conversion efficiency ($\eta_p$)=3.1% under one sun illumination. FIG. 4(b) illustrates a single cell, fabricated as an example of the present disclosure. The donor layer of the second single cell may be fabricated using 26 nm of 1-NPSQ as the donor material, spin-coated from a THF solution. Device performance of FIG. 4(b) was lower than typical, as shown in Table 2 as the "Back" cell, with $\eta_p$=2.1%. This was likely due to the larger than optimal thickness of the donor layer.

A tandem OPV device may be then fabricated with the following structure: glass/ITO/MoO$_3$ (6 nm)/DPSQ (from Chloroform) (12 nm)/C$_{60}$ (40 nm)/PTCBI (5 nm)/Ag (0.5 nm)/MoO$_3$: Ag (1 vol %) (100 nm)/1-NPSQ (from THF) (26 nm)/C$_{60}$ (40 nm)/PTCBI (8 nm)/Ag (100 nm), as shown in FIG. 4(c). As seen in Table 2, the tandem device had $\eta_p$=2.6%. The tandem device's Voc was 1.80 V, which is very close to the sum of the front and back cells individually (Voc=0.92 V and 0.90 V, respectively).

As shown in FIG. 4 and Table 2, this shows that an open circuit voltage of a tandem device fabricated using the present disclosure may have an open-circuit voltage (Voc) nearly equal to the sum of the subcell's open-circuit voltages. In some embodiments, Voc of a tandem device fabricated using the present disclosure has more than about 90% of the sum of the subcell's Voc values. In some embodiments, Voc of a tandem device fabricated using the present disclosure has about 90%, 91%, 92%, 93%, 94%, 95%, 96%, 97%, 98%, or 99% of the sum of the subcell's Voc values. In some embodiments, Voc of a tandem device fabricated using the present disclosure has about 98.1%, 98.2%, 98.3%, 98.4%, 98.5%, 98.6%, 98.7%, 98.8%, 98.9%, 99%, 99.1%, 99.2%, 99.3%, 99.4%, 99.5%, 99.6%, 99.7%, 99.8% or 99.9% of the sum of the subcell's Voc values. In one embodiment, Voc of a tandem device fabricated using the present disclosure has about 98.9% of the sum of the subcell's Voc values In some embodiments, substrates including ITO may be cleaned before used in Tregitol, deionized water, acetone, trichloroethylene, acetone, or isopropanol. In some embodiments, substrates may be subject to a UV-ozone treatment. The first layer material may be purified, for example, by thermal gradient sublimation.

In some embodiments, the deposited second layer has a thickness ranging from about 1 nm to about 50 nm, such as 1 nm, 5 nm, 10 nm, 15 nm, 20 nm, 25 nm, 30 nm, 35 nm, 40 nm, 45 nm, or 50 nm. In some embodiments, the thickness is 26 nm. As used herein the "thickness" refers to the thickness of the layer (e.g., the thickness of the layer of the squaraine compound) as opposed to the molecular characteristics (e.g., bond distances) of materials that form any given layer.

In one embodiment, the first, second, or third layer may be a discontinuous layer. As used herein, the term "discontinuous layer" is intended to mean a layer (e.g., a layer of a squaraine compound) that does not have a uniform thickness throughout the layer. In one embodiment, the discontinuous layer of the invention is a layer that does not completely cover all portions of the layer (or substrate) onto which it was deposited, thereby resulting in some portions of that layer being exposed after depositing the discontinuous layer.

The organic photosensitive optoelectronic devices described herein may function as a device or solar cell, photodetector or photoconductor. Whenever the organic photosensitive optoelectronic devices function as a PV device, the materials used in the photoconductive organic layers and the thicknesses thereof may be selected, for example, to optimize the external quantum efficiency of the device. Whenever the organic photosensitive optoelectronic devices function as photodetectors or photoconductors, the materials used in the photoconductive organic layers and the thicknesses thereof may be selected, for example, to maximize the sensitivity of the device to desired spectral regions.

As noted, the organic photosensitive optoelectronic devices described herein may function as photodetectors. In this embodiment, the device may be a multilayer organic device. In some embodiments, the device may be a tandem solar cell device.

Various devices made according to the foregoing disclosures were made and tested. The embodiments described herein are further illustrated by the following non-limiting examples:

EXAMPLES

Substrates consisting of indium tin oxide-coated glass (ITO) (150 nm, <15Ω, Prazisions Glas & Optik GmbH) quartz (qtz), or silicon were cleaned sequentially in Tergitol, deionized water, acetone, trichloroethylene, acetone, and isopropanol. C$_{60}$ (MER, 99.9% sublimed) was purified once by thermal gradient sublimation at <1×10-7 Torr. Other materials were used as received. ITO substrates were subjected to a UV-ozone treatment for 600 seconds and transferred into a nitrogen glovebox with <0.1 ppm $O_2$ and $H_2O$. Substrates were loaded into a high-vacuum chamber with base pressure<1×104 Torr. Materials were evaporated at 0.10 nm/s. After deposition of $MoO_3$, samples were transferred to a $N_2$ glovebox, where squaraine films were deposited from solution via spin coating. Substrates are then transferred to the vacuum chamber for evaporation of subsequent layers. All rates were measured by quartz crystal monitor and calibrated by spectroscopic ellipsometry.

Device performance was measured in a nitrogen glovebox with <1.0 ppm $O_2$ and <0.1 ppm $H_2O$ by an Agilent semiconductor parameter analyzer under illumination by a 150 W Xe lamp with AM1.5G filters (Oriel). Lamp intensity was varied by using neutral density filters and measured using an NREL-calibrated Si photodiode. Incident light intensity was determined by using the spectral correction factor, determined from the lamp intensity and device and detector responsivities.

Example 1

A structure was fabricated to simulate a tandem OPV: glass/ITO (150 nm)/$MoO_3$ (8 nm)/2,4-bis[4-(N-Phenyl-1-naphthylamino)-2,6-dihydroxyphenyl]squaraine (1-NPSQ) (8 nm)/$C_{60}$ (40 nm)/3,4,9,10 perylenetetracarboxylic bisbenzimidazole (PTCBI) (5 nm)/Ag (1 nm)/$MoO_3$ (8 nm). For the first sample, a solution of 2,4-bis[4-(N,N-diphenylamino)-2,6-dihydroxyphenyl] squaraine (DPSQ) dissolved in 1,2-dichlorobenzene (DCB) was spin-coated as it would be in a tandem device. As seen in the optical micrographs in FIG. 1(a), there was significant damage to the underlying film. Alternatively, when a solution of 1-NPSQ dissolved in Tetrahydrofuran (THF) was spin-coated onto a second sample, it can be seen in FIG. 1(b) that the resulting film is much smoother. The small particles seen in this image are due to undissolved crystals in the solution which would be removed by filtering the solution.

Example 2

Figure 2:
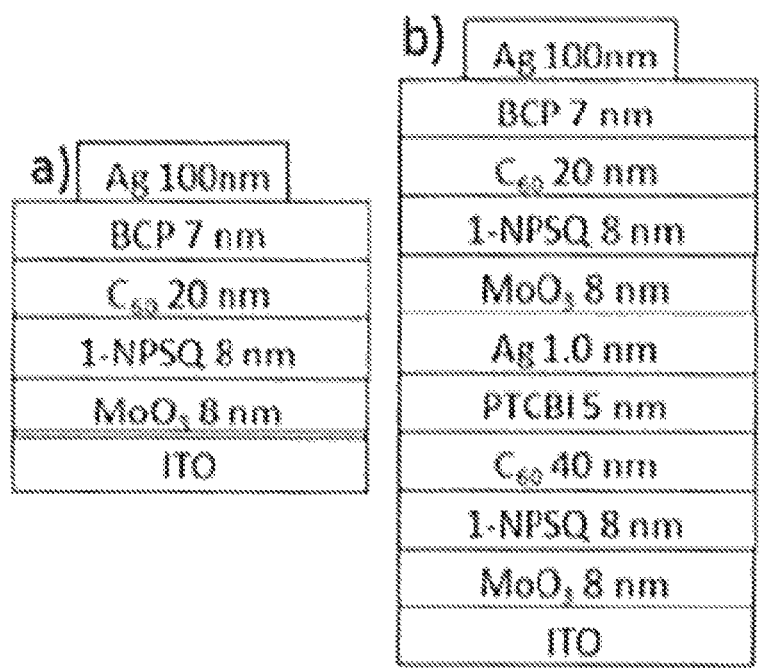
FIG. 2 illustrates schematic structures of the single and tandem OPV devices fabricated using DCB.
Figure 3:
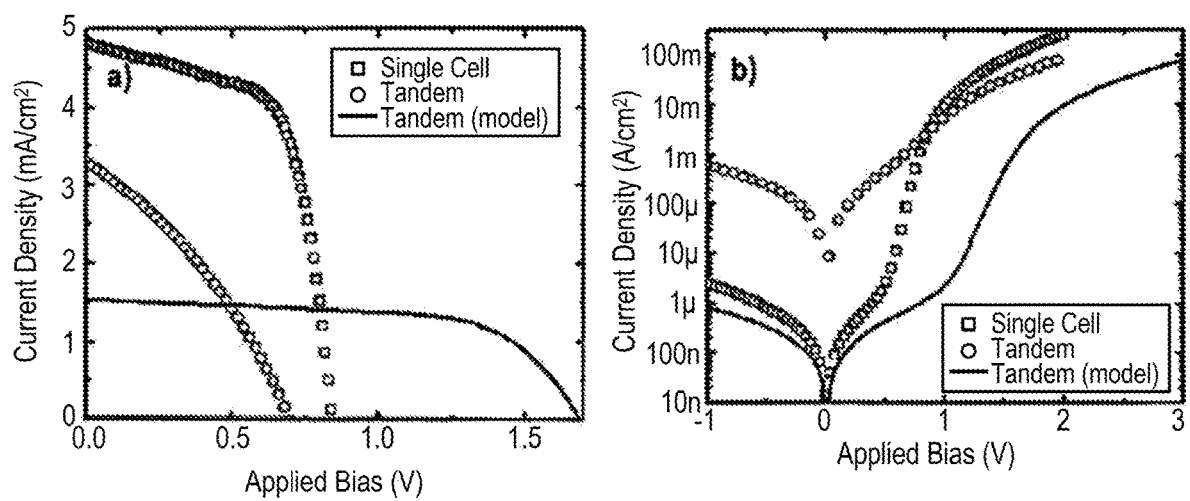
FIG. 3 illustrates a linear plot of the J-V characteristic of single and tandem devices corresponding to FIG. 2 under one-sun simulated illumination (a) and semilog (b) plots of the J-V characteristic in the dark.

A tandem OPV was fabricated using DCB as the solvent for both donor layers as shown in FIG. 2. The single cell consisted of glass/ITO (150 nm)/$MoO_3$ (8 nm)/1-NPSQ (from DCB) (8 nm)/$C_{60}$ (20 nm)/BCP (7 nm)/Ag (100 nm) as shown in FIG. 2(a). The tandem consisted of glass/ITO/$MoO_3$ (8 nm)/1-NPSQ (from DCB) (8 nm)/$C_{60}$ (40 nm)/PTCBI (5 nm)/Ag (1 nm)/$MoO_3$ (8 nm)/1-NPSQ (from DCB) (8 nm)/$C_{60}$ (20 nm)/bathocuproine (BCP) (7 nm)/Ag (100 nm), as shown in FIG. 2(b). The ITO serves as the anode, $MoO_3$ as an anode buffer layer, $C_0$ as the acceptor, 3,4,9,10 perylenetetracarboxylic bisbenzimidazole (PTCBI) or bathocuproine (BCP) as the cathode buffer, and Ag as the cathode, the ultra-thin Ag layer acts as a carrier recombination zone. The performance of the two devices is summarized in Table 1, and the J-V characteristics are shown in FIG. 3. By utilizing a simple model of two diodes in series, we can predict the open-circuit voltage (Voc) of the tandem device to be approximately double that of the single cell; however, in this case the tandem device results in Voc=0.70 V, which is lower than even the single cell. Based on the damage seen in FIG. 1 a, we infer that the front cell has been damaged so much that it is not functional. This leads to the tandem device operating like a single cell in series with a resistor, which leads to decreased Voc and fill factor (FF).

TABLE 1

Device performance at one sun illumination for two devices

| Device | $J_{SC}$ (A/W) | $V_{OC}$ (V) | FF | $\eta_p$ (%) |
|---|---|---|---|---|
| Single | 4.8 | 0.85 | 0.63 | 2.6 |
| Tandem | 3.3 | 0.70 | 0.33 | 0.76 |
| Tandem (model) | 2.1 | 1.62 | 0.63 | 2.1 |

Example 3

Single and tandem OPVs were fabricated similar to Example 2, but in this example, the second donor material was spin-coated from a THF solution. For single cells, the device structure consists of the following: glass/ITO (150 nm)/$MoO_3$ (6 nm)/donor material/$C_{60}$ (40 nm)/buffer/Ag (100 nm), as shown in FIGS. 4 (a) and (b). A control device was fabricated using 12 nm of DPSQ as the donor material, spin-coated from a chloroform solution. Device performance was typical, as shown in Table 2 as the "Front" cell, with a power conversion efficiency ($\eta_p$)=3.1% under one sun illumination. A second device was fabricated using 26 nm of 1-NPSQ as the donor material, spin-coated from a THF solution. Device performance was lower than typical, as shown in Table 2 as the "Back" cell, with $\eta_p$=2.1%. This was likely due to the larger than optimal thickness of the donor layer.

Figure 5:
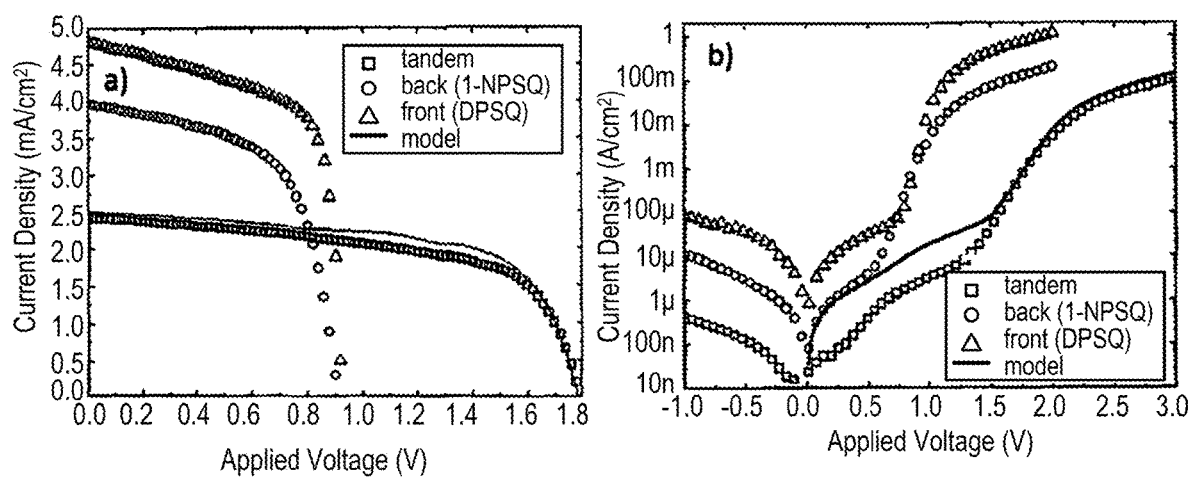
FIG. 5 illustrates Linear plot of the J-V characteristic of single and tandem devices corresponding to FIG. 4 under one-sun simulated illumination (a) and semilog plot of the J-V characteristic in the dark.

A tandem OPV device was then fabricated with the following structure: glass/ITO/$MoO_3$ (6 nm)/DPSQ (from Chloroform) (12 nm)/$C_{60}$ (40 nm)/PTCBI (5 nm)/Ag (0.5 nm)/$MoO_3$: Ag (1 vol %) (100 nm)/1-NPSQ (from THF) (26 nm)/$C_{60}$ (40 nm)/PTCBI (8 nm)/Ag (100 nm), as shown in FIG. 4 (c). As seen in Table 2, the tandem device had $\eta_p$=2.6%. The tandem device's Voc was 1.80 V, which is very close to the sum of the front and back cells individually (Voc=0.92 V and 0.90 V, respectively). FIG. 5 shows Linear plot of the J-V characteristic of single and tandem devices corresponding to FIG. 4 under one-sun simulated illumination (a) and semilog (b) plot of the J-V characteristic in the dark.

Figure 6:
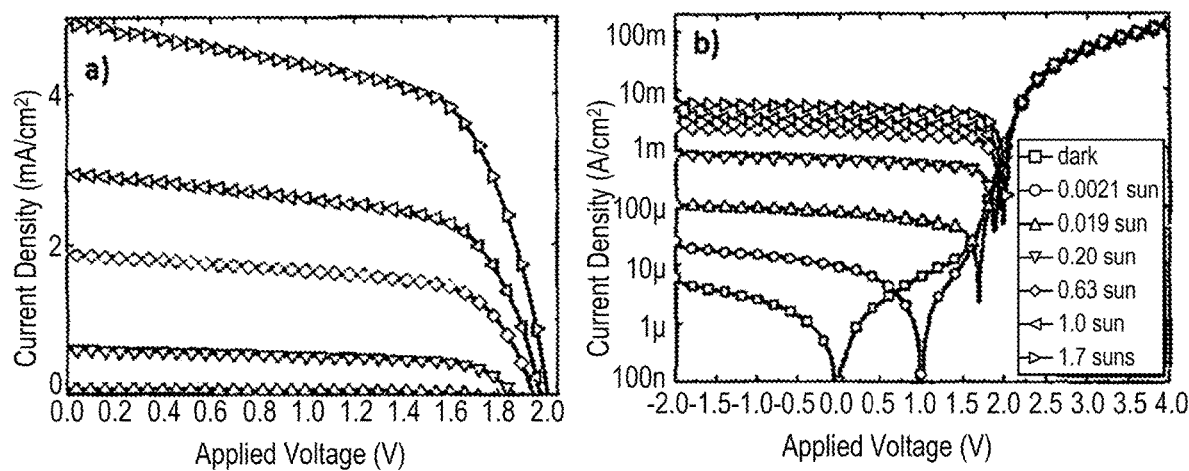
FIG. 6 illustrates linear (a) and semilog (b) plots of the J-V characteristic a tandem device under various illumination intensities.

Comparing the dark J-V characteristics of the tandem to the model in FIG. 5b, a good agreement at forward bias can be seen, which indicates there is not an increased series resistance compared to the subcells. This confirms that both subcells are functioning normally and there is efficient charge recombination occurring between in the connecting layer. FIG. 6 shows linear (a) and semilog (b) plots of the J-V characteristic a tandem device under various illumination intensities. This shows the J-V characteristics of the tandem device as a function of incident light intensity.

TABLE 2

Device performance at one sun illumination for three devices

| Device | $J_{SC}$ (A/W) | $V_{OC}$ (V) | FF | $\eta_p$ (%) |
|---|---|---|---|---|
| Front | 5.0 | 0.92 | 0.68 | 3.1 |
| Back | 3.9 | 0.90 | 0.59 | 2.1 |
| Tandem | 2.5 | 1.80 | 0.59 | 2.6 |

Unless otherwise indicated, all numbers expressing quantities of ingredients, reaction conditions, and other properties or parameters used in the specification are to be understood as being modified in all instances by the term "about." Accordingly, unless otherwise indicated, it should be understood that the numerical parameters set forth in the following specification and attached claims are approximations. At the very least, and not as an attempt to limit the application of the doctrine of equivalents to the scope of the claims, numerical parameters should be read in light of the number of reported significant digits and the application of ordinary rounding techniques.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An organic photosensitive optoelectronic device comprising:
   a first layer comprising one or more of a first layer material;
   a second layer comprising one or more of a second layer material; and
   a third layer comprising one or more of a third layer material,
   wherein the second layer is dissolved in a semi-orthogonal solvent, and
   wherein the first layer and the third layer are very slightly soluble or practically insoluble in the semi-orthogonal solvent.

2. The device of claim 1, wherein the second layer is deposited via spin coating.

3. The device of claim 1, wherein the first layer material is chosen from perylenes, pthalocyanines, porphyrins, napthalenes, fullerenes, nanotubules, and derivatives thereof.

4. The device of claim 1, wherein the first layer material is chosen from $C_{60}$, $C_{70}$, $C_{76}$, $C_{82}$, $C_{84}$, and derivatives thereof.

5. The device of claim 1, wherein the second layer material is chosen from squaraines or squaraine derivatives.

6. The device of claim 1, wherein the second layer material is chosen from:
   2,4-bis[4-N-carbazolo-2,6-dihydroxyphenyl] squaraine (CBZSQ);
   2,4-bis[4-N-phenothiazino-2,6-dihydroxyphenyl] squaraine (PTSQ);
   2,4-bis[4-(N,N-diphenylamino)-2,6-dihydroxyphenyl] squaraine (DPSQ);
   2,4-bis[4-(N-Phenyl-1-naphthylamino)-2,6-dihydroxyphenyl] squaraine (1NPSQ);
   2,4-bis[4-(N-Phenyl-2-naphthylamino)-2,6-dihydroxyphenyl] squaraine (2NPSQ);
   {2-[4-(N,N-diisobutylamino)-2,6-dihydroxyphenyl]-4-diphenylamino} squaraine (USSQ);
   {2-[4-(N,N-diphenylamino)-2,6-dihydroxyphenyl]-4-diphenylamino} squaraine (DPUSQ); and
   diphenylamino-squarate (YSQ).

7. The device of claim 1, wherein the third layer material is chosen from Al, Ag, Au, $MoO_3$, Li, LiF, Sn, Ti, $WO_3$, indium tin oxide (ITO), tin oxide (TO), gallium indium tin oxide (GITO), zinc oxide (ZO), zinc indium tin oxide (ZITO) and derivatives thereof.

8. The device of claim 1, wherein the semi-orthogonal solvent is a heterocyclic organic compound.

9. The device of claim 1, wherein the semi-orthogonal solvent is chosen from tetrahydrofuran and tetrahydrofuran derivatives.

10. The device of claim 1, wherein the first layer material is chosen from $C_{60}$, $C_{70}$, $C_{76}$, $C_{82}$, $C_{84}$, and derivatives thereof;
    wherein the second layer material is chosen from CBZSQ, PTSQ, DPSQ, 1NPSQ, 2NPSQ, USSQ, DPUSQ, and YSQ;
    wherein the third layer material is chosen from Al, Ag, Au, $MoO_3$, Li, LiF, Sn, Ti, $WO_3$, indium tin oxide (ITO), tin oxide (TO), gallium indium tin oxide (GITO), zinc oxide (ZO), zinc indium tin oxide (ZITO) and derivatives thereof; and
    wherein the semi-orthogonal solvent is chosen from tetrahydrofuran or tetrahydrofuran derivatives.

11. The device of claim 1, wherein 1 ml of the semi-orthogonal solvent dissolves about 0.05 mg or less of the first layer and the third layer at 25° C.; and
    wherein 1 ml of the semi-orthogonal solvent dissolves about 100 mg or more of the second layer at 25° C.

12. The device of claim 11, wherein the device is a bulk heterojunction organic photovoltaic device or a tandem organic photovoltaic device.

* * * * *